United States Patent [19]
Mishiro

[11] Patent Number: 4,652,786
[45] Date of Patent: Mar. 24, 1987

[54] TORSIONAL VIBRATION APPARATUS
[75] Inventor: Shoji Mishiro, Kawasaki, Japan
[73] Assignee: Taga Electric Co., Ltd., Tokyo, Japan
[21] Appl. No.: 804,151
[22] Filed: Dec. 3, 1985
[51] Int. Cl.[4] .............................................. H01L 41/08
[52] U.S. Cl. .................................... 310/333; 310/328; 310/359; 310/366; 310/369
[58] Field of Search ............................. 310/357–359, 310/328, 333, 366, 369

[56] References Cited
U.S. PATENT DOCUMENTS

| | | | |
|---|---|---|---|
| 2,838,696 | 6/1958 | Thurston | 310/333 X |
| 2,880,334 | 3/1959 | Mason | 310/359 |
| 3,719,907 | 3/1973 | Adler | 310/333 X |
| 3,757,257 | 9/1973 | Knitter | 310/333 X |
| 3,774,057 | 11/1973 | Tsubouchi | 310/333 X |
| 3,859,546 | 1/1975 | Doi et al. | 310/333 X |
| 3,992,693 | 11/1976 | Martin et al. | 310/369 UX |

FOREIGN PATENT DOCUMENTS 50-9159  4/1975  Japan .

Primary Examiner—Mark O. Budd
Attorney, Agent, or Firm—Oblon, Fisher, Spivak, McClelland & Maier

[57] ABSTRACT

In the present invention, a plurality of electrodes are formed on the two surfaces of a circular member of electrostrictive material, and every adjacent electrodes are simultaneously so polarized as to be mutually reverse in the circumferential direction.

10 Claims, 13 Drawing Figures

TORSIONAL VIBRATION APPARATUS

FIELD OF THE INVENTION AND RELATED ART STATEMENT

The present invention relates to a torsional vibration apparatus for use in a machine tool or the like.

In general, torsional vibration is utilized in a variety of industrial fields. For example, if a machining operation is performed with application of ultrasonic vibration to a cutting edge in a machine tool such as a lathe, miller, driller or tapper, a cutting resistance is remarkably reduced to enhance the machining precision, hence prolonging the service life of the tool as well as facilitating the machining of a hard-to-cut material. A torsional vibration generator adapted for such use requires a relatively great power. In order to achieve the purpose mentioned above, there is proposed an appartus employing an electrostriction element which is polarized in its circumferential direction and generates slide vibration in such direction in response to a driving voltage applied thereto in the direction of thickness, wherein the electrostriction element is held between metallic members integrally and is activated to induce resonant vibration.

A conventional example of such electrostriction element will now be described with reference to FIG. 1. A multiplicity of electrodes 2 are arrayed at equal intervals with respect to the circumference of an annular electrostriction element 1 in such a manner as to extend from one surface thereof to the other via the peripheral face, and a high DC voltage is applied between mutually adjacent electrodes to polarize each of the entire electrodes sequentially in the circumferential direction as shown by arrows. Posterior to the polarization along the whole circumference, the entire electrodes are removed and subsequently the two surfaces are relapped to correct the surface flow caused by the polarization, and electrodes are formed again on the two surfaces to produce a desired electrostriction element.

Meanwhile in an exemplary torsional vibration generator, as disclosed in Japanese Patent Publication No. 50-9159, a plurality of electrostriction elements are mutually superposed to be electrically parallel with each other and, after metallic members are joined to the two sides thereof, they are clamped together by means of a center bolt or the like.

However, in the electrostriction element mentioned above, polarization of mutually adjacent electrodes for producing residual polarities in the circumferential direction needs to be repeated so many times as the number of divisions. In addition, if such polarization is to be executed uniformly in the circumferential direction, it follows that the number of divisions naturally increases, hence bringing about extreme complication in the operation required.

Furthermore, since the polarization is performed partially, the material is prone to crack due to the concomitant strain, thereby lowering the yield rate as a result. Besides the above, in case the number of such divisions is small, reverse electric fields are generated in other portions through circumferential shift in such a manner as to cancel the required polarities, whereby the effect of polarization is diminished.

OBJECT AND SUMMARY OF THE INVENTION

It is an object of the present invention to provide an improved torsional vibration apparatus in which merely a single step of polarization is sufficient to accomplish the purpose without inducing any cracking trouble and still enhanced effect of division is achievable.

In the present invention where a plurality of electrodes are formed on the surface of a circular member of electrostrictive material, every adjacent electrodes are so polarized as to be mutually reverse in the circumferential direction, so that the step of polarization needs to be executed merely once and therefore no cracking fault is caused by such polarization with another advantage of attaining remarkably great polarization effect.

DETAILED DESCRIPTION OF PREFERRED EMBODIMENTS

Figure 1:
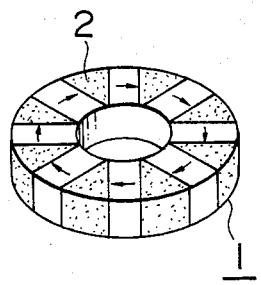
FIG. 1 is a perspective view of a conventional electrostriction element.
Figure 2:
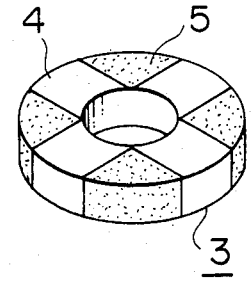
FIG. 2 is a perspective view of an exemplary member of electrostrictive material employed in an embodiment of the present invention.
Figure 3:
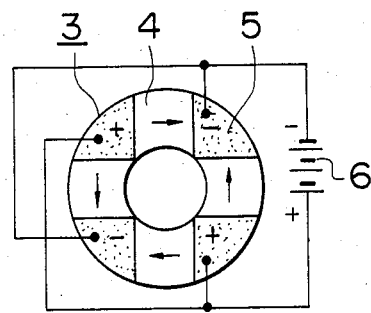
FIG. 3 is a plan view showing how a polarizing operation is performed.

Hereinafter an exemplary embodiment of the present invention will be described with reference to FIGS. 2 through 8. This embodiment employs four divided segmental electrodes. First in FIG. 2 showing a member of electrostrictive material, electrodes 5 to be polarized extend from one surface of an annular electrostriction element 3 to the other surface via a peripheral face with a belt-like cross portion 4 left diametrically. In the annular electrostriction element 3, a polarizing power supply 6 is connected thereto to execute polarization in such a manner that the polarities of every adjacent electrodes 5 become opposite to each other. As a result, mutually reverse polarities are produced in the adjacent electrodes as indicated by arrows in FIG. 3 and are rendered residual in the electrostriction element 3. The entire electrodes are removed posterior to such polarization, and driving segmental electrodes 7 are formed on one surface as shown in FIG. 4 with an angular deviation of 45 degrees from the aforesaid electrodes 5 in the circumferential direction, while a common electrode is formed on the entirety of the other surface to produce a desired electrostriction element 8.

Figure 4:
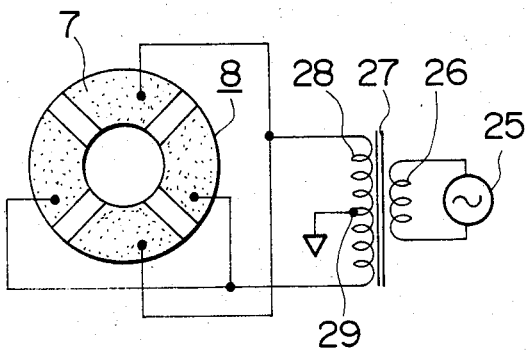
FIG. 4 is a plan view of an electrostriction element where driving electrodes are formed.
Figure 5:
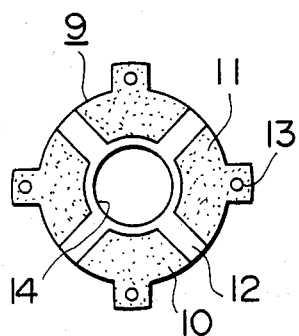
FIG. 5 is a plan view of an electrode plate.

An electrode plate 9 shown in FIG. 5 is composed of a printed-circuit board which is obtained by sticking copper foil to the two surfaces of a glass epoxy thin plate 10. Electrodes 11 identical in shape with the driving segmental electrodes 7 of FIG. 4 are formed on the two surfaces with interelectrode spaces 12 left thereon, and further a terminal 13 is provided in each of the electrodes 11 with a bore 14 formed at the center.

Figure 6:
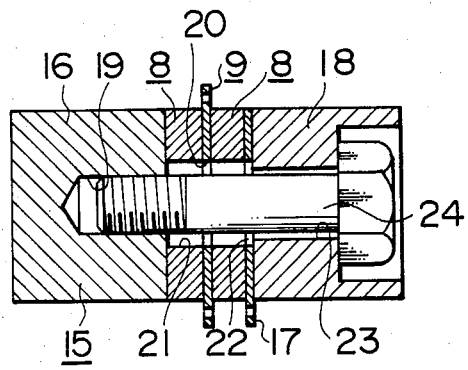
FIG. 6 is a vertical sectional side view of a torsional vibration generator.

The electrostriction element 8 and the electrode plate 9 thus produced are assembled as shown in FIG. 6 to constitute a torsional vibration generator 15. The driving segmental electrodes 7 are joined to the electrodes 11 on both sides of the electrode plate 9, and a metal member 16 is joined to the exterior surface of one of the electrostriction elements 8. Meanwhile, a conductive ground electrode 17 is joined to the entire exterior surface of the other electrostriction element 8, and a metal member 18 is further joined to the exterior surface of the ground electrode 17. A screw hole 19 is formed in the metal member 16, and through-holes 20, 21, 22 and 23 are formed respectively in the aforesaid electrode plate 9, electrostriction element 8, ground electrode 17 and metal member 18, which are integrally clamped by means of a threaded rod 24 inserted into the screw hole 19 via the through-holes 20, 21, 22 and 23. For the purpose of preventing dielectric breakdown that may be induced by interelectrode creeping discharge, it is preferred that an insulating paint or the like be applied to the gaps between the electrodes of the electrostriction element 8 and the electrode plate 9 at the time of assembly.

Electric connection is executed as illustrated in FIG. 4, wherein a primary coil 26 of a transformer 27 is connected to a driving power supply 25, and a midpoint 29 of a secondary coil 28 of the transformer 27 is connected to the ground electrode 17 while the two ends of the secondary coil 28 are connected to the driving segmental electrodes 7 in such a manner that the polarities of the adjacent electrodes 7 become opposite to each other. In addition to the metal member 18 connected directly to the ground electrode 17, the metal member 16 is also connected thereto through the threaded rod 24.

Figure 7:
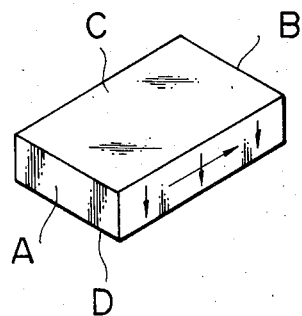
FIG. 7 is a perspective view illustrating slide vibration.
Figure 8:
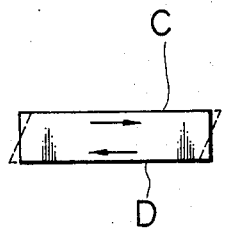
FIG. 8 is a plan view of FIG. 7.

Before describing the operation in this embodiment of the structure mentioned above, an explanation will be given first on the principle of slide vibration with reference to FIGS. 7 and 8. Initially, electrodes are formed on sides A and B of a rectangular member of electrostrictive material as illustrated and are polarized longitudinally. Then the electrodes on the sides A and B are removed therefrom, and further electrodes are formed on sides C and D. In this arrangement, when an electric field is applied in the direction of thickness which is perpendicular to the direction of polarization, the sides C and D are distorted in the direction of polarization. If a high-frequency voltage impressed to the sides C and D is tuned to the slide resonance frequency, resonant vibration is induced in the longitudinal direction.

Accordingly, upon application of a voltage to the driving segmental electrodes 7 in this embodiment, the electrostriction element 8 is distorted in the direction of polarization. The regions of the element 8 under the driving segmental electrodes 7 are previously so polarized that the adjacent ones have mutually reverse polarities in the circumferential direction, but the direction of the applied voltage is reverse with respect to the adjacent driving segmental electrodes 7, so that the resultant slide forces become directionally equal to each other along the circumference, and consequently the torsional vibration generator 15 causes torsional resonant vibration which has its maximum amplitude at the two ends of the generator 15 and oscillates in mutually opposite directions circumferentially.

Figures 9A, 9B:
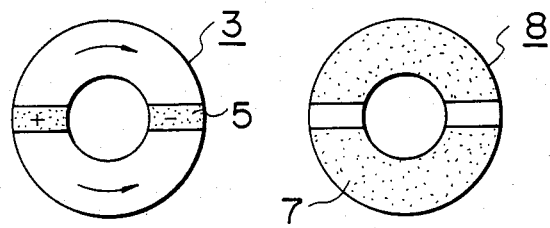
FIGS. 9A and B and 10A and B are plan views of modified electrostriction elements.
Figures 10A, 10B:
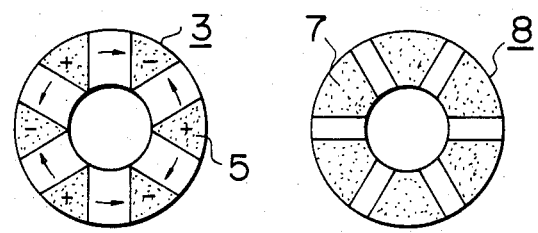

FIGS. 9 and 10 show exemplary modifications of the electrostriction element 8. Referring first to the modification of FIG. 9, two segmental electrodes 5 to be polarized are formed by division in the circumferential direction as shown in FIG. 9 (A) and then are so polarized as indicated by arrows to produce driving segmental electrodes 7 as shown in FIG. 9 (B). In another modification of FIG. 10 (A) and (B), six segmental electrodes are formed by division and then are polarized in the same manner as the foregoing.

Although in the aforesaid embodiment the entire components are clamped together by means of the threaded rod 24, the structure may be so altered as to eliminate the center hole and to employ peripheral bolts for clamping the components. Furthermore, any number of electrostriction elements 8 may be assembled as required.

The electrode plate 9 composed of a printed-circuit board with a glass epoxy substrate in the aforesaid embodiment may be replaced with an insulator board of ceramics or the like with electrodes formed thereon by evaporation, plating or printing. In addition, the torsional vibration generator 15 may be constituted of a single electrostriction element 8 with electrodes 11 formed merely on one side of the electrode plate 9.

Figure 11:
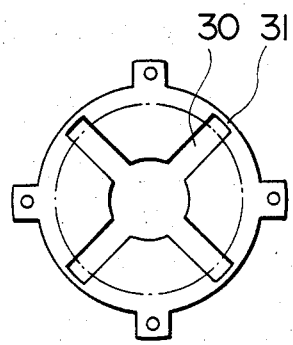
FIG. 11 is a plan view of a modified electrode plate.

Another modified electrode plate 9 is shown in FIG. 11. This example has a diameter greater than that of the electrostriction element 8, and slots 30 are formed in the shape of a cross extending from a center bore. Posterior to assembly, peripheral connecting portions 31 around the slots 30 are cut off to obtain separate electrodes 11.

According to the present invention, as described hereinabove, an even number of segmental electrodes are formed on an electrostriction element and are so polarized that every adjacent electrodes produce mutually reverse residual polarities. Consequently, the required polarization in the circumferential direction can be executed by a single step of operation to eventually ensure remarkably great effect of polarization, hence simplifying the process in manufacture of a high-power torsional vibration generator without inducing any cracking trouble of the element during the polarization and further raising the yield rate to the utmost extent.

I claim:

1. A torsional vibration apparatus comprising:
(a) an at least generally cylindrical electrode plate having two end surfaces, each end surface of said at least generally cylindrical electrode plate having an even number of driving segmental electrodes formed thereon, each adjacent pair of said even number of driving segmental electrodes being separated by a radially extending non-conductive interelectrode space;
(b) a pair of at least generally cylindrical electrostrictive elements, each one of said pair of at least generally cylindrical electrostrictive elements having an outer diameter at least approximately equal to the outer diameter of said at least generally cylindrical electrode plate, an inner end surface, and an outer end surface, the inner end surface of each one of said pair of at least generally cylindrical electrostrictive elements being in planar contact with an adjacent end surface of said at least generally cylindrical electrode plate, each one of said pair of at least generally cylindrical electrostrictive elements being composed of an even number of driving segmental electrodes identical in number and in cross-sectional shape to said driving segmental electrodes on the adjacent end face of said at least generally cylindrical electrode plate and being in congruent relationship therewith, each adjacent pair of said even number of driving segmental electrodes being separated by a radially extending, non-conductive, belt-like cross-portion which is in congruent relationship with a corresponding one of said radially extending non-conductive interelectrode spaces on the adjacent end face of said at least generally cylindrical electrode plate, said driving segmental electrodes having been previously polarized such that the driving segmental electrodes in each adjacent pair of said driving segmental electrodes have mutually reverse polarities;

(c) an at least generally cylindrical ground electrode having an outer diameter at least approximately equal to the outer diameter of said at least generally cylindrical electrode plate, an inner end surface, and an outer end surface, the inner end surface of said at least generally cylindrical ground electrode being in planar contact and congruent relationship with an adjacent outer end surface of one of said pair of at least generally cylindrical electrostrictive elements;

(d) a pair of at least generally cylindrical metal members, each one of said pair of at least generally cylindrical metal members having an outer diameter at least approximately equal to the outer diameter of said at least generally cylindrical electrode plate, an inner end surface, and an outer end surface, the inner end surface of one of said pair of at least generally cylindrical metal members being in planar contact and congruent relationship with the outer end surface of said at least generally cylindrical ground electrode and the inner end surface of the other one of sid pair of at least generally cylindrical metal members being in planar contact and congruent relationship with an adjacent outer end surface of the other one of said pair of at least generally cylindrical electrostrictive elements;

(e) first means for clamping said at least generally cylindrical electrode plate, said pair of at least generally cylindrical electrostrictive elements, said at least generally cylindrical ground electrode, and said pair of at least generally cylindrical metal members together; and (f) second means for applying current to said even number of driving segmental electrodes on said end face of said at least generally cylindrical electrode plate.

2. A torsional vibration apparatus as recited in claim 1 wherein said at least generally cylindrical electrode plate is a printed-circuit board.

3. A torsional vibration apparatus as recited in claim 2 wherein said printed-circuit board comprises a thin glass epoxy plate sandwiched between two layers of copper foil.

4. A torsional vibration apparatus as recited in claim 2 wherein said printed-circuit board comprises an insulator board made of ceramic.

5. A torsional vibration apparatus as recited in claim 1 wherein two driving segmental electrodes are formed on each end surface of said generally cylindrical electrode plate.

6. A torsional vibration apparatus as recited in claim 1 wherein four driving segmental electrodes are formed on each end surface of said generally cylindrical electrode plate.

7. A torsional vibration apparatus as recited in claim 1 wherein six driving segmental electrodes are formed on each end surface of said generally cylindrical electrode plate.

8. A torsional vibration apparatus as recited in claim 1 wherein said second means comprises a terminal projecting radially outwardly from each one of said driving segmental electrodes on each end surface of said at least generally cylindrical electrode plate.

9. A torsional vibration apparatus as recited in claim 1 wherein all of said driving segmental electrodes on each end surface of said at least generally cylindrical electrode plate are identical in shape and separated by identical radially extending non-conductive interelectrode spaces.

10. A torsional vibration apparatus as recited in claim 1 wherein said first means comprises an axially extending threaded rod threadedly received in one of said pair of at least generally cylindrical metal members.

* * * * *